United States Patent
Chen et al.

(10) Patent No.: US 9,379,722 B2
(45) Date of Patent: Jun. 28, 2016

(54) FREQUENCY DIVIDER WITH DUTY CYCLE ADJUSTMENT WITHIN FEEDBACK LOOP

(71) Applicant: QUALCOMM Incorporated, San Diego, CA (US)

(72) Inventors: Wu-Hsin Chen, San Diego, CA (US); Sriramgopal Sridhara, San Diego, CA (US); Li Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/926,631

(22) Filed: Jun. 25, 2013

(65) Prior Publication Data

US 2014/0375363 A1    Dec. 25, 2014

(51) Int. Cl.

| | |
|---|---|
| *H03K 21/00* | (2006.01) |
| *H03K 23/00* | (2006.01) |
| *H03K 25/00* | (2006.01) |
| *H03L 7/18* | (2006.01) |
| *H03K 3/017* | (2006.01) |
| *H03K 5/156* | (2006.01) |
| *H03K 21/08* | (2006.01) |

(52) U.S. Cl.
CPC *H03L 7/18* (2013.01); *H03K 3/017* (2013.01); *H03K 5/1565* (2013.01); *H03K 21/08* (2013.01)

(58) Field of Classification Search
CPC . H03K 23/68; H03K 23/667; H03K 5/00006; G06F 7/68; G06F 1/08
USPC .................................................. 327/115, 117
See application file for complete search history.

(56) References Cited

U.S. PATENT DOCUMENTS

| | | |
|---|---|---|
| 3,805,192 A | 4/1974 | Ocnaschek et al. |
| 6,198,322 B1 | 3/2001 | Yoshimura |
| 6,218,974 B1 * | 4/2001 | Dedic ........................... 341/144 |
| 6,356,129 B1 | 3/2002 | O'brien et al. |
| 7,444,534 B2 | 10/2008 | Panchal |
| 7,839,195 B1 | 11/2010 | Feng et al. |
| 7,956,696 B2 | 6/2011 | Hoang et al. |
| 2008/0136540 A1 | 6/2008 | Li |

(Continued)

FOREIGN PATENT DOCUMENTS

| | | |
|---|---|---|
| EP | 2 056 459 A1 | 5/2009 |
| WO | WO-2007/146590 A2 | 12/2007 |

OTHER PUBLICATIONS

International Search Report dated Sep. 22, 2014 issued in International Patent Application No. PCT/US2014/042920.

*Primary Examiner* — Lincoln Donovan
*Assistant Examiner* — Diana J Cheng
(74) *Attorney, Agent, or Firm* — Arent Fox LLP

(57) ABSTRACT

A frequency divider with duty cycle adjustment within a feedback loop is disclosed. In an exemplary design, an apparatus includes at least one divider circuit and at least one duty cycle adjustment circuit coupled in a feedback loop. The divider circuit(s) receive a clock signal at a first frequency and provide at least one divided signal at a second frequency, which is a fraction of the first frequency. The duty cycle adjustment circuit(s) adjust the duty cycle of the at least one divided signal and provide at least one duty cycle adjusted signal to the divider circuit(s). The divider circuit(s) may include first and second latches, and the duty cycle adjustment circuit(s) may include first and second duty cycle adjustment circuits. The first and second latches and the first and second duty cycle adjustment circuits may be coupled in a feedback loop and may perform divide-by-2.

23 Claims, 8 Drawing Sheets

(56) References Cited

U.S. PATENT DOCUMENTS

| | | | |
|---|---|---|---|
| 2010/0134154 A1* | 6/2010 | He | 327/115 |
| 2012/0169382 A1* | 7/2012 | Hung | 327/115 |
| 2013/0015891 A1 | 1/2013 | Cicalini | |
| 2013/0187686 A1 | 7/2013 | Yuan et al. | |
| 2013/0314137 A1* | 11/2013 | Chang | 327/175 |

* cited by examiner

US 9,379,722 B2

FREQUENCY DIVIDER WITH DUTY CYCLE ADJUSTMENT WITHIN FEEDBACK LOOP

BACKGROUND

I. Field

The present disclosure relates generally to electronics, and more specifically to a frequency divider.

II. Background

A frequency divider is a circuit that receives a clock signal at a first frequency and provides a divided signal at a second frequency, which is lower than the first frequency. For example, a frequency divider may divide a clock signal by a factor of two in frequency and provide a divided signal at half the frequency of the clock signal.

Frequency dividers are commonly used in various circuits such as local oscillator (LO) generators. For example, an LO generator may include (i) an oscillator to generate an oscillator/clock signal at a first frequency and (ii) a frequency divider to divide the oscillator/clock signal and provide divided signals at a second frequency. The divided signals may be used to generate inphase (I) and quadrature (Q) LO signals, which may be used by a receiver for frequency downconversion and/or by a transmitter for frequency upconversion.

It may be desirable to generate LO signals having an adjustable duty cycle. The duty cycle of LO signals for a receiver may determine when mixers in the receiver are turned on. The duty cycle of the LO signals may thus have a large impact on linearity of the receiver and may affect various performance metrics such as second-order input intercept point (IIP2). It may be desirable to adjust the duty cycle of the LO signals in order to obtain good linearity.

SUMMARY

A frequency divider with duty cycle adjustment within a feedback loop is disclosed herein. In an exemplary design, an apparatus may include at least one divider circuit and at least one duty cycle adjustment circuit. The at least one divider circuit may be coupled in a feedback loop and may receive a clock signal at a first frequency and provide at least one divided signal at a second frequency. The second frequency may be a fraction of the first frequency. The at least one duty cycle adjustment circuit may be coupled to the at least one divider circuit within the feedback loop, may adjust the duty cycle of the at least one divided signal, and may provide at least one duty cycle adjusted signal to the at least one divider circuit.

In an exemplary design, the at least one divider circuit may include first and second latches. The first latch may receive the clock signal and provide a first divided signal. The second latch may receive the clock signal and provide a second divided signal. The at least one duty cycle adjustment circuit may include first and second duty cycle adjustment circuits. The first duty cycle adjustment circuit may receive the first divided signal from the first latch and provide a first duty cycle adjusted signal to the second latch. The second duty cycle adjustment circuit may receive the second divided signal from the second latch and provide a second duty cycle adjusted signal to the first latch. The first and second latches and the first and second duty cycle adjustment circuits may perform divide-by-2.

Various aspects and features of the disclosure are described in further detail below.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
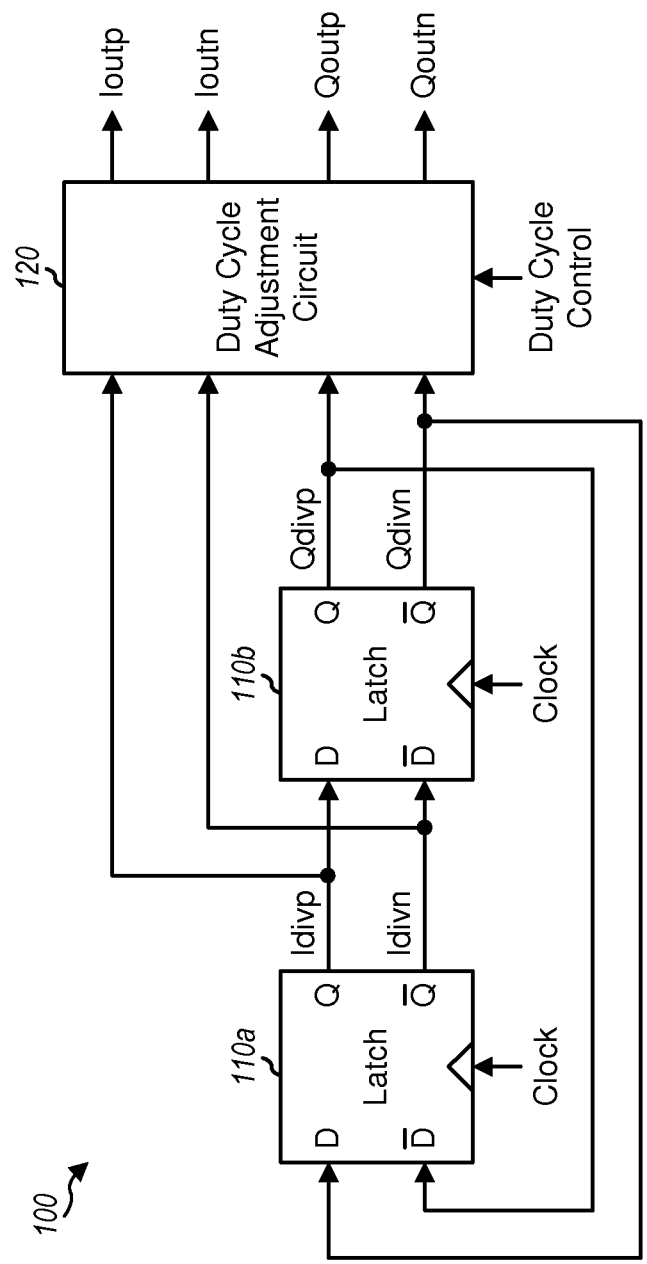
FIG. 1 shows a frequency divider with duty cycle adjustment outside of a feedback loop.

FIG. 1 shows a block diagram of a frequency divider 100 with duty cycle adjustment outside of a feedback loop. Frequency divider 100 includes two latches 110a and 110b and a duty cycle adjustment circuit 120. Latches 110a and 110b are coupled in a feedback loop and implement a divide-by-2 divider. The Q and $\overline{Q}$ outputs of first latch 110a are coupled to the D and $\overline{D}$ inputs, respectively, of second latch 110b. The Q and $\overline{Q}$ outputs of second latch 110b are swapped and coupled to the $\overline{D}$ and D inputs, respectively, of first latch 110a. Latches 110a and 110b also receive a clock signal.

First latch 110a provides complementary Idivp and Idivn divided signals at its Q and $\overline{Q}$ outputs, respectively, to duty cycle adjustment circuit 120. Second latch 110b provides complementary Qdivp and Qdivn divided signals at its Q and $\overline{Q}$ outputs, respectively, to duty cycle adjustment circuit 120. The Idivp, Idivn, Qdivp and Qdivn signals are at one half the frequency of the clock signal. Duty cycle adjustment circuit 120 generates four output signals Ioutp, Ioutn, Qoutp and Qoutn having the desired duty cycle based on the four divided signals Idivp, Idivn, Qdivp and Qdivn, respectively. Duty cycle adjustment circuit 120 may adjust the duty cycle of the Ioutp, Ioutn, Qoutp and Qoutn signals.

In FIG. 1, latches 110a and 110b are coupled in a feedback loop and form a divide-by-2 divider. Duty cycle adjustment circuit 120 is located after the divide-by-2 divider and outside of the feedback loop. The slew rate of the Idivp, Idivn, Qdivp and Qdivn signals may be amplified and sharpened by latches 110a and 110b. Hence, it may be much harder to change the duty cycle of the Idivp, Idivn, Qdivp and Qdivn signals from latches 110a and 110b. Furthermore, extra battery power may be consumed to adjust the duty cycle of the Idivp, Idivn, Qdivp and Qdivn signals from latches 110a and 110b.

Figure 2A:
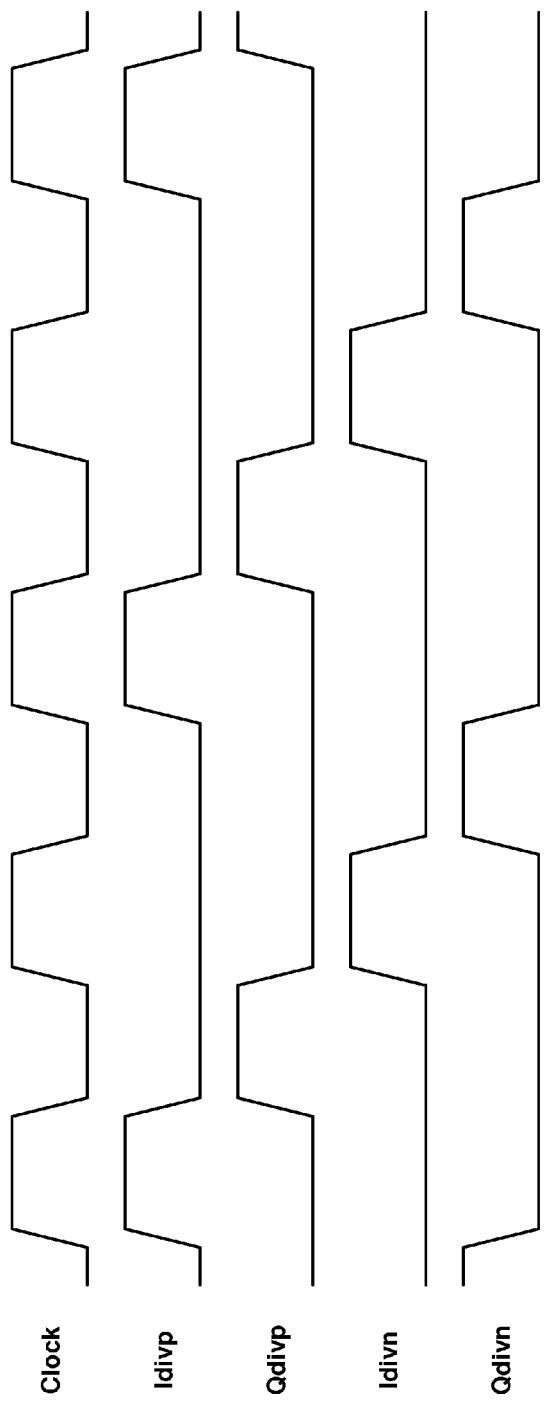
FIG. 2A shows a clock signal and divided signals for the frequency divider in FIG. 1.

FIG. 2A shows a timing diagram of the clock signal and the Idivp, Idivn, Qdivp and Qdivn signals from latches 110a and 110b in FIG. 1. The clock signal is shown at the top of FIG. 2A. The Idivp and Idivn signals are delayed relative to each other by one clock cycle. The Qdivp and Qdivn signals are also delayed relative to each other by one clock cycle. The Qdivp signal is delayed by one half clock cycle relative to the Idivp signal.

Figure 2B:
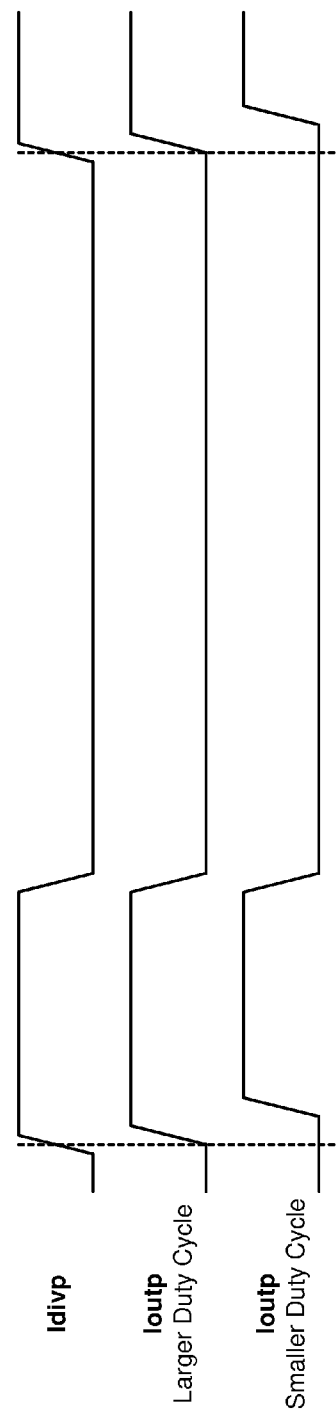
FIG. 2B shows adjustment of the duty cycle of a divided signal.

FIG. 2B shows adjustment of the duty cycle of the Ioutp signal. The Idivp signal is shown at the top of FIG. 2B. The Idivp signal has a fixed duty cycle, which may be determined by the circuit design of latches 110a and 110b. An Ioutp signal with a larger duty and an Ioutp signal with a smaller duty are shown below the Idivp signal. The duty cycle of the Ioutp signal may be increased by delaying the rising/leading transition of the Ioutp signal by a smaller amount relative to the rising/leading transition of the Idivp signal. The duty cycle of the Ioutp signal may be reduced by delaying the rising/leading transition of the Ioutp signal by a larger amount relative to the rising/leading transition of the Idivp signal.

Figure 3:
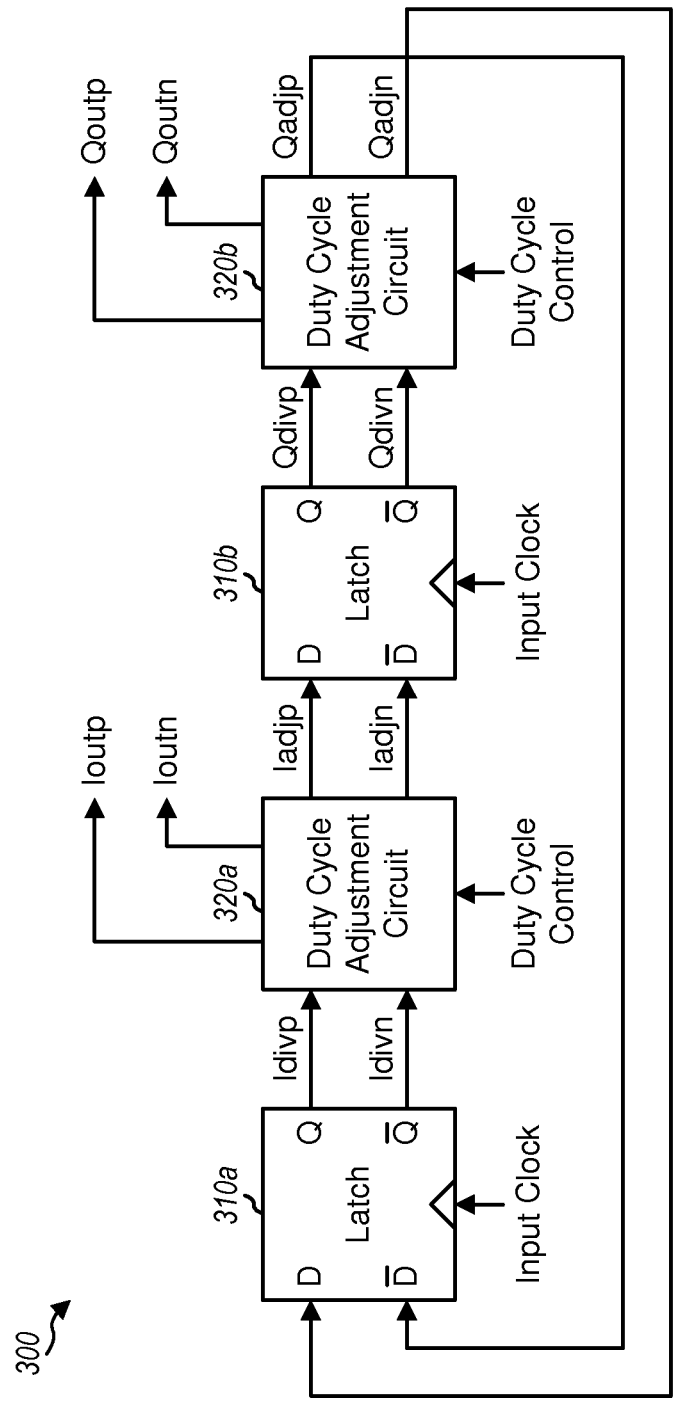
FIG. 3 shows an exemplary design of a frequency divider with duty cycle adjustment within a feedback loop.

FIG. 3 shows a block diagram of an exemplary design of a frequency divider 300 with duty cycle adjustment within a feedback loop. Frequency divider 300 includes two latches 310a and 310b and two duty cycle adjustment circuits 320a and 320b, which are coupled in a feedback loop and implement a divide-by-2 divider. First latch 310a has (i) its D and $\overline{D}$ inputs coupled to the outputs of duty cycle adjustment circuit 320b and (ii) its Q and $\overline{Q}$ outputs coupled to the inputs of duty cycle adjustment circuit 320a. Second latch 310b has (i) its D and $\overline{D}$ inputs coupled to the outputs of duty cycle adjustment circuit 320a and (ii) its Q and $\overline{Q}$ outputs coupled to the inputs of duty cycle adjustment circuit 320b.

First latch 310a provides Idivp and Idivn divided signals at its Q and $\overline{Q}$ outputs, respectively, to duty cycle adjustment circuit 320a. Duty cycle adjustment circuit 320a generates Iadjp and Iadjn signals based on the Idivp and Idivn signals, respectively. The Iadjp and Iadjn signals are duty cycle adjusted signals having the desired duty cycle. Duty cycle adjustment circuit 320a also provides Ioutp and Ioutn output signals having the desired duty cycle. The Ioutp and Ioutn signals may be buffered versions of the Iadjp and Iadjn signals, respectively. Duty cycle adjustment circuit 320a may adjust the duty cycle of the Iadjp, Iadjn, Ioutp and Ioutn signals. Similarly, second latch 310b provides Qdivp and Qdivn divided signals at its Q and $\overline{Q}$ outputs, respectively, to duty cycle adjustment circuit 320b. Duty cycle adjustment circuit 320b generates Qadjp and Qadjn duty cycle adjusted signals having the desired duty cycle based on the Qdivp and Qdivn signals, respectively. Duty cycle adjustment circuit 320b also provides Qoutp and Qoutn signals having the desired duty cycle. The Qoutp and Qoutn signals may be buffered versions of the Qadjp and Qadjn signals, respectively. Duty cycle adjustment circuit 320b may adjust the duty cycle of the Qadjp, Qadjn, Qoutp and Qoutn signals.

As shown in FIG. 3, duty cycle adjustment circuits 320a and 320b are located within the feedback loop. Duty cycle adjustment circuit 320a can adjust the duty cycle of the Iadjp and Iadjn signals, which are generated based on the Idivp and Idivn signals from first latch 310a. Duty cycle adjustment circuit 320b can adjust the duty cycle of the Qadjp and Qadjn signals, which are generated based on the Qdivp and Qdivn signals from latch 310b.

Latches 310a and 310b and duty cycle adjustment circuits 320a and 320b in FIG. 3 may be implemented in various manners. Some exemplary designs of latches 310a and 310b and duty cycle adjustment circuits 320a and 320b are described below.

Figure 4:
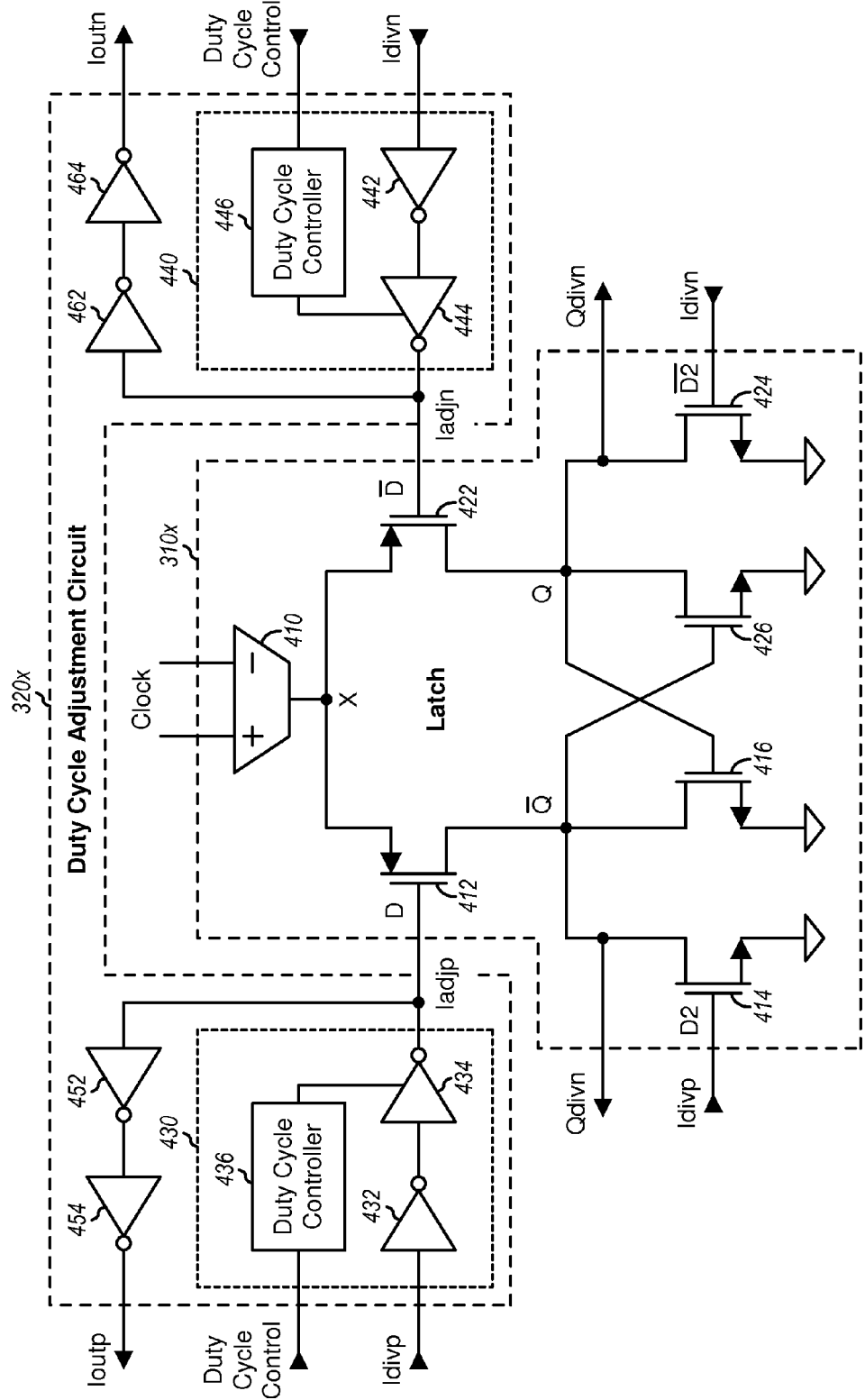
FIG. 4 shows an exemplary design of a latch and a duty cycle adjustment circuit.

FIG. 4 shows a schematic diagram of an exemplary design of a latch 310x and a duty cycle adjustment circuit 320x. Latch 310x may be used for each of latches 310a and 310b in FIG. 3. Duty cycle adjustment circuit 320x may be used for each of duty cycle adjustment circuits 320a and 320b in FIG. 3. For clarity, FIG. 4 shows latch 310x being used for latch 310b, receiving the Iadjp and Iadjn signals, and providing the Qdivp and Qdivn signals. FIG. 4 also shows duty cycle adjustment circuit 320x being used for duty cycle adjustment circuit 320a, receiving the Idivp and Idivn signals, and providing the Iadjp and Iadjn signals.

In the design shown in FIG. 4, latch 310x includes a gm cell 410, P-channel metal oxide semiconductor (PMOS) transistors 412 and 422, and N-channel metal oxide semiconductor (NMOS) transistors 414, 416, 424 and 426. Gm cell 410 has its non-inverting (+) input and inverting (−) input receiving a differential clock signal and its output coupled to node X. PMOS transistor 412 has its source coupled to node X, its gate coupled to a D input of latch 310x, and its drain coupled to a $\overline{Q}$ output of latch 310x. PMOS transistor 422 has its source coupled to node X, its gate coupled to a $\overline{D}$ input of latch 310x, and its drain coupled to a Q output of latch 310x. NMOS transistor 414 has its source coupled to circuit ground, its gate coupled to a D2 input of latch 310x, and its drain coupled to the $\overline{Q}$ output of latch 310x. NMOS transistor 416 has its source coupled to circuit ground, its gate coupled to the Q output of latch 310x, and its drain coupled to the $\overline{Q}$ output of latch 310x. NMOS transistor 424 has its source coupled to circuit ground, its gate coupled to a $\overline{D2}$ input of latch 310x, and its drain coupled to the Q output of latch 310x. NMOS transistor 426 has its source coupled to circuit ground, its gate coupled to the $\overline{Q}$ output of latch 310x, and its drain coupled to the Q output of latch 310x.

In the design shown in FIG. 4, duty cycle adjustment circuit 320x includes a duty cycle adjustment circuit 430 for the Idivp signal and a duty cycle adjustment circuit 440 for the Idivn signal. Duty cycle adjustment circuits 430 includes inverters 432 and 434 and a duty cycle controller 436. Inverter 432 has its input receiving the Idivp signal and its output coupled to the input of inverter 434. Inverter 434 has its output coupled to the D input of latch 310x and providing the Iadjp signal to the gate of PMOS transistor 412. Duty cycle controller 436 has its input receiving a duty cycle control signal and its output providing an adjustable bias current for inverter 434. Similarly, duty cycle adjustment circuits 440 includes inverters 442 and 444 and a duty cycle controller 446. Inverter 442 has its input receiving the Idivn signal and its output coupled to the input of inverter 444. Inverter 444 has its output coupled to the $\overline{D}$ input of latch 310x and providing the Iadjn signal to the gate of PMOS transistor 422. Duty cycle controller 446 has its input receiving the duty cycle control signal and its output providing an adjustable bias current for inverter 444.

Latch 310x operates as follows. PMOS transistor 412 and NMOS transistor 414 form a first inverter that receives the Iadjp and Idivp signals and provides the Qdivn signal at the $\overline{Q}$ output of latch 310x. PMOS transistor 422 and NMOS transistor 424 form a second inverter that receives the Iadjn and Idivn signals and provides the Qdivp signal at the Q output of latch 310x. NMOS transistors 416 and 426 maintain the logic value at the Q and $\overline{Q}$ outputs of latch 310x.

Duty cycle adjustment circuit 430 operates as follows. Inverter 432 buffers the Idivp signal and provides a buffered Idivp signal. Inverter 434 further buffers the buffered Idivp signal and provides the Iadjp signal. The rising/leading transition of the Iadjp signal may be adjusted by varying the bias current of inverter 434. In particular, the rising/leading transition of the Iadjp signal may be (i) advanced with a larger bias current for inverter 434 or (ii) delayed with a smaller bias current for inverter 434. Duty cycle adjustment circuit 440 operates in similar manner as duty cycle adjustment circuit 430 and provides the Iadjn signal having an adjustable duty cycle. The duty cycles of the Qadjp and Qadjn signals may be adjusted in similar manner (and independently of) the duty cycles of the Iadjp and Iadjn signals.

Latch 310x may be used for latch 310a, as shown in FIG. 4. In this case, latch 310x may receive the Iadjp and Iadjn signals at its D and $\overline{D}$ inputs, receive the Idivp and Idivn signals at its D2 and $\overline{D2}$ inputs, and provide the Qdivp and Qdivn signals at its Q and $\overline{Q}$ outputs, as shown in FIG. 4. Latch 310x may also be used for latch 310b (not shown in FIG. 4). In this case, latch 310x may receive the Qadjp and Qadjn signals at its D and $\overline{D}$ inputs, receive the Qdivp and Qdivn signals at its D2 and $\overline{D2}$ inputs, and provide the Idivp and Idivn signals at its Q and $\overline{Q}$ outputs. Latch 310b may be implemented in similar manner as latch 310a.

Duty cycle adjustment circuit 320x may be used for duty cycle adjustment circuit 320b, as shown in FIG. 4. In this case, duty cycle adjustment circuit 430 may receive the Idivp signal and provide the Iadjp signal, and duty cycle adjustment circuit 440 may receive the Idivn signal and provide the Iadjn signal. Duty cycle adjustment circuit 320x may also be used for duty cycle adjustment circuit 320a (not shown in FIG. 4). In this case, duty cycle adjustment circuit 430 may receive the Qdivp signal and provide the Qadjp signal, and duty cycle adjustment circuit 440 may receive the Qdivn signal and provide the Qadjn signal. Duty cycle adjustment circuits 320b may be implemented in similar manner as duty cycle adjustment circuits 320a.

FIG. 4 shows an exemplary design of latch 310x. A latch may also be implemented in other manners. For example, gm cell 410 may be replaced with a PMOS transistor having its source coupled to a power supply voltage, a gate receiving the clock signal, and a drain coupled to node X. NMOS transistors 414 and 424 may be either removed or replaced with resistors coupled between the Q and $\overline{Q}$ outputs and circuit ground.

FIG. 4 shows an exemplary design in which duty cycle adjustment circuit 430 includes two inverters 432 and 434, with inverter 432 having a fixed bias current and inverter 434 having an adjustable bias current. Adjustable bias current may also be provided in other manners. In another design, both inverters 432 and 434 may have adjustable bias currents. In yet another design, inverter 432 may have an adjustable bias current, and inverter 434 may have a fixed bias current. In this case, the adjustable bias current provided to inverter 432 may be set in an inverse manner as compared to the adjustable bias current provided to inverter 434. For example, a smaller duty cycle may be obtained with a larger bias current provided to inverter 434 or a smaller bias current provided to inverter 432.

A duty cycle adjustment circuit may include any number of inverters. In one design, a duty cycle adjustment circuit may include an even number of inverters (e.g., two inverters) to generate a duty cycle adjusted signal (e.g., the Iadjp signal) based on a divided signal (e.g., the Idivp signal). In this design, the duty cycle adjusted signal would have the same polarity as the divided signal. In another design, a duty cycle adjustment circuit may include an odd number of inverters (e.g., one inverter) to generate the duty cycle adjusted signal based on the divided signal. In this design, the duty cycle adjusted signal would have an opposite polarity as the divided signal. For example, inverter 432 may be omitted, and inverter 434 may receive the Idivn signal at its input and provide the Iadjp signal at its output. Alternatively or additionally, inverter 454 may be omitted, and inverter 452 may receive the Iadjp signal at its input and provide the Ioutn signal at its output. Fewer buffers may reduce power consumption whereas more buffers may improve slew rate. The number of buffers may be selected based on a tradeoff between power consumption and slew rate.

Figure 5:
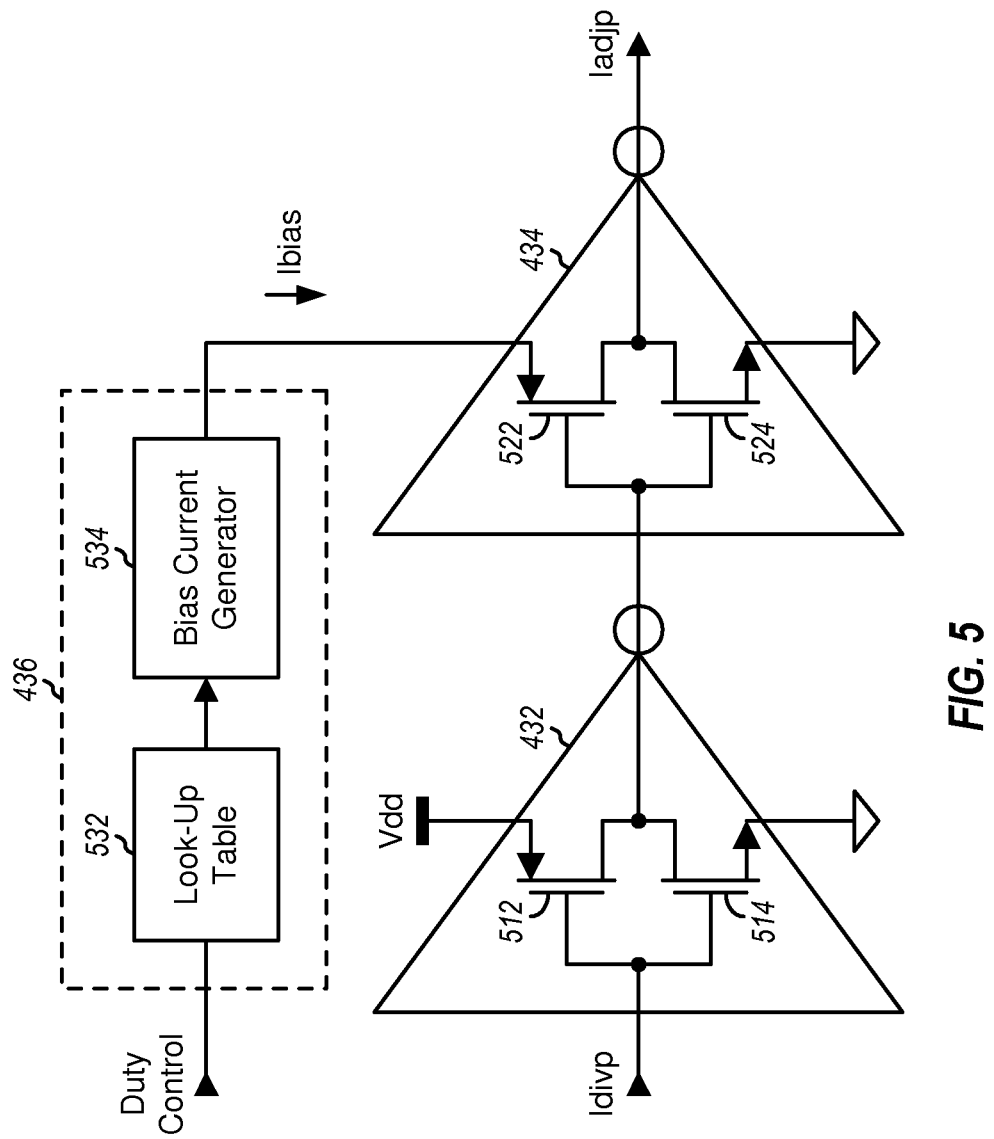
FIG. 5 shows an exemplary design of inverters and a duty cycle controller within the duty cycle adjustment circuit in FIG. 4.

FIG. 5 shows a schematic diagram of an exemplary design of inverters 432 and 434 and duty cycle controller 436 within duty cycle adjustment circuit 430 in FIG. 4. In this design, inverter 432 includes a PMOS transistor 512 and an NMOS transistor 514 having their gates coupled together and their drains coupled together. The source of PMOS transistor 512 is coupled to a power supply (Vdd), and the source of NMOS transistor 514 is coupled to circuit ground. Inverter 434 includes a PMOS transistor 522 and an NMOS transistor 524 having their gates coupled together and their drains coupled together. The source of PMOS transistor 522 is coupled to the output of duty cycle controller 436 and receives an adjustable bias current of Ibias. The source of NMOS transistor 524 is coupled to circuit ground.

In the design shown in FIG. 5, duty cycle controller 436 includes a look-up table 532 and a bias current generator 534. Look-up table 532 receives a duty control signal indicative of the desired duty cycle of the Iadjp signal and provides one or more control signals. Bias current generator 534 generates the adjustable bias current for inverter 434 based on the one or more control signals from look-up table 532. The duty cycle of the Iadjp signal may be adjusted by varying the bias current of inverter 434, which may then vary the slew rate of the Iadjp signal. A larger bias current may result in a faster slew rate, which may then result in a larger duty cycle. Conversely, a smaller bias current may result in a slower slew rate, which may then result in a smaller duty cycle.

FIG. 3 shows an exemplary design of a frequency divider that divides by two and comprises two latches and two duty cycle adjustment circuits coupled in a feedback loop. In general, a frequency divider may divide a clock signal by any divider ratio and provide divided signals of a desired duty cycle. A frequency divider may include any number of circuits and any type of circuit within a feedback loop to obtain the desired frequency divider ratio and the desired duty cycle for the divided signals.

Figure 6:
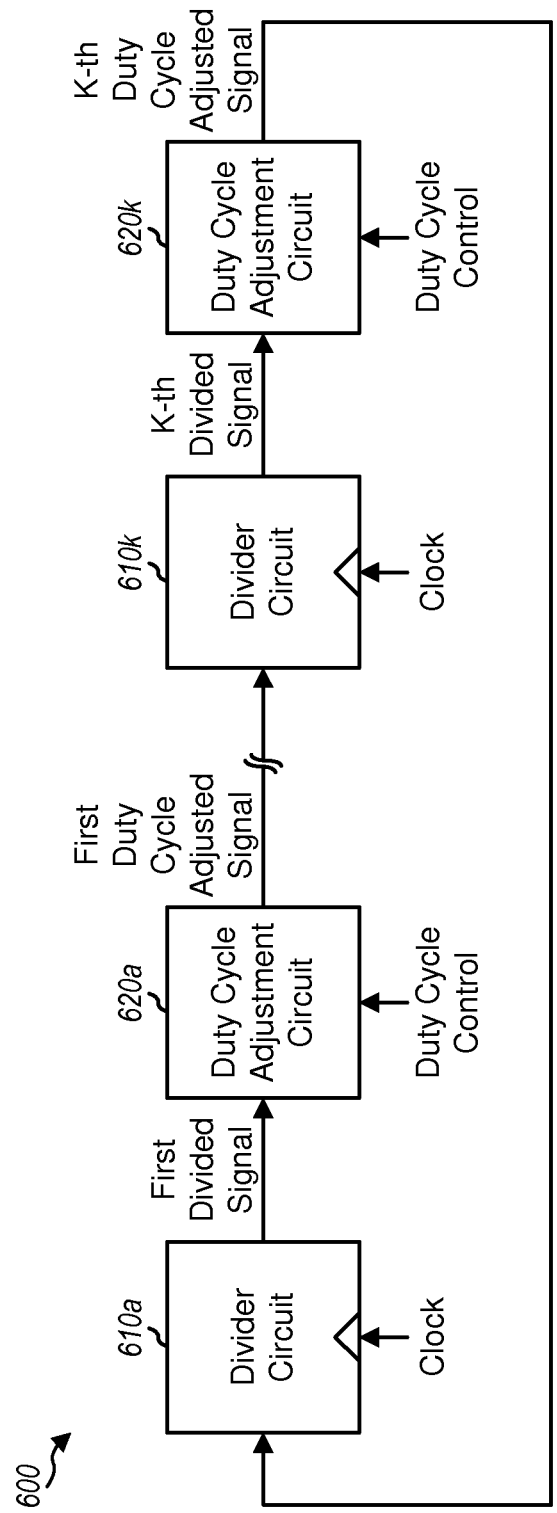
FIG. 6 shows another exemplary design of a frequency divider with duty cycle adjustment within a feedback loop.

FIG. 6 shows a block diagram of an exemplary design of a frequency divider 600 with duty cycle adjustment within a feedback loop. Frequency divider 600 includes K divider circuits 610a to 610k and K duty cycle adjustment circuits 620a to 620k coupled in a feedback loop, where K may be any integer value. In general, a frequency divider may include any number of divider circuits and any number of duty cycle adjustment circuits coupled in a feedback loop. In one design, the same number of divider circuits and duty cycle adjustment circuits may be coupled in a feedback loop. In this design, each divider circuit 610 may have its input coupled to a preceding duty cycle adjustment circuit 620 and its output coupled to a succeeding duty cycle adjustment circuit 620. In another design, K divider circuits and fewer than K duty cycle adjustment circuits may be coupled in a feedback loop. In this design, one or more divider circuits 610 may have their outputs coupled to duty cycle adjustment circuit 620, and one or more other divider circuits 610 may have their outputs coupled to succeeding divider circuits 610.

Each divider circuit 610 may comprise one or more latches and/or other circuits that can facilitate division of a clock signal in frequency. For example, each divider circuit 610 may comprise a single latch, and frequency divider 600 may implement a divide-by-K divider with K latches coupled in the feedback loop. Latches of different types (e.g., D-type latches, JK-type latches, etc.) may be used for divider circuits 610.

Each duty cycle adjustment circuit 620 may be implemented in similar manner as duty cycle adjustment circuit 320x in FIG. 4 or based on some other circuit design. The K duty cycle adjustment circuits 620a to 620k may be implemented with the same circuit design or different circuit designs.

A frequency divider with duty cycle adjustment within a feedback loop, as disclosed herein, may be used for various applications. An exemplary use of the frequency divider in a wireless communication device is described below.

Figure 7:
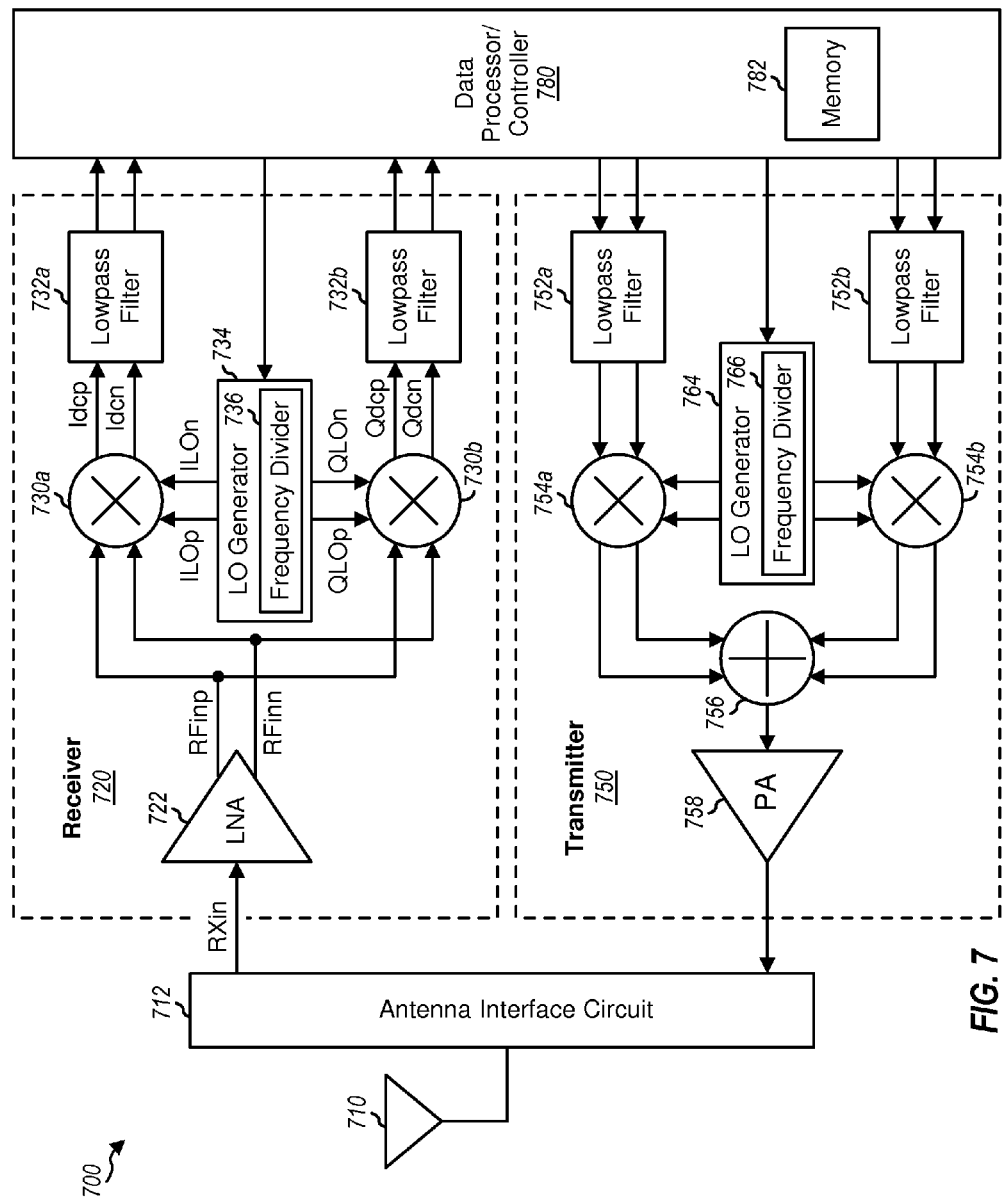
FIG. 7 is a block diagram of an exemplary design of a wireless communication device according to an embodiment.

FIG. 7 shows a block diagram of an exemplary design of a wireless communication device 700, which may be a cellular phone, a smartphone, a tablet, etc. Wireless device 700 may support one or more radio technologies for wireless communication such as Long Term Evolution (LTE), Code Division Multiple Access (CDMA) 1×, Wideband CDMA (WCDMA), Global System for Mobile Communications (GSM), IEEE 802.11, etc. For simplicity, FIG. 7 shows wireless device 700 including one receiver 720 and one transmitter 750 for one antenna 710. In general, wireless device 700 may include any number of transmitters, any number of receivers, and any number of antennas to support communication for any number of radio technologies and any number of frequency bands.

In the receive path, antenna 710 receives downlink signals from base stations and/or other transmitter stations and provides an antenna output signal to an antenna interface circuit 712. Circuit 712 routes the antenna output signal and provides a received RF signal (RXin) to receiver 720. Circuit 712 may include switches, duplexers, diplexer, filters, matching circuits, etc.

Within receiver 720, a low noise amplifier (LNA) 722 amplifies the received RF signal and provides an input RF signal (RFin) to mixers 730a and 730b. Mixer 730a downconverts the input RF signal with an I LO signal (ILO) from an LO generator 734 and provides an I downconverted signal (Idc). Some signals within receiver 720 may be differential signals comprising non-inverting signals (with "p" suffix) and inverting signals (with "n" suffix). A lowpass filter 732a filters the Idc signal and provides an I input baseband signal to a data processor/controller 780. Similarly, mixer 730b downconverts the input RF signal with a Q LO signal (QLO) from LO generator 734 and provides a Q downconverted signal (Qdc). A lowpass filter 732b filters the Qdc signal and provides a Q input baseband signal to data processor 780. Processor 780 digitizes and processes the I and Q input baseband signals to recover data sent to wireless device 700.

In the transmit path, data processor 780 processes data to be transmitted and provides I and Q output baseband signals to transmitter 750. Within transmitter 750, the I and Q output baseband signals are filtered by lowpass filters 752a and 752b, upconverted by mixers 754a and 754b, summed by a summer 756, and amplified by a power amplifier (PA) 758 to generate an output RF signal having the desired output power level. The output RF signal is routed through antenna interface circuit 712 and transmitted via antenna 710. An LO generator 764 generates I and Q LO signals for mixers 754a and 754b, respectively.

LO generator 734 generates I and Q LO signals for mixers 730a and 730b within receiver 720. LO generator 764 generates I and Q LO signals for mixers 754a and 754b within transmitter 750. LO generators 734 and 764 may each include one or more voltage controlled oscillators (VCOs), phase locked loops (PLLs), reference oscillators, frequency dividers, buffers, etc. For example, LO generator 734 may include a frequency divider 736 with duty cycle adjustment within a feedback loop. LO generator 764 may include a frequency divider 766 with duty cycle adjustment within a feedback loop. Frequency dividers 736 and 766 may each be implemented with frequency divider 300 in FIG. 3, frequency divider 600 in FIG. 6, etc.

FIG. 7 shows an exemplary design of receiver 720 and transmitter 750. In general, the conditioning of signals in a receiver or a transmitter may be performed by than or more amplifiers, filters, mixers, etc. These circuits may be arranged differently from the configuration shown in FIG. 7. Furthermore, a receiver and/or a transmitter may include other circuits not shown in FIG. 7, such as matching circuits. All or a portion of receiver 720 and transmitter 750 may be implemented on one or more RF integrated circuits (RFICs), analog ICs, mixed-signal ICs, etc. For example, mixers 730 and LO generator 734 may be implemented on an RFIC.

Data processor/controller 780 may perform various functions for wireless device 700. For example, data processor 780 may perform processing for data being received via receiver 720 and data being transmitted via transmitter 750. Controller 780 may control the operation of receiver 720 and transmitter 750. For example, controller 780 may control the operation of frequency dividers 736 and 766. A memory 782 may store program codes and data for data processor/controller 780. Data processor/controller 780 may be implemented on one or more application specific integrated circuits (ASICs) and/or other ICs.

The circuits within wireless device 700 may be implemented in various manners. Furthermore, the circuits may be implemented with NMOS transistors, PMOS transistors, and/or transistors of other types.

A novel frequency divider with duty cycle adjustment within a feedback loop, as disclosed herein, may have various advantages. First, the novel frequency divider may provide better duty cycle control than a conventional frequency divider with duty cycle adjustment outside a feedback loop. Better duty cycle control may be possible due to adjustment of the duty cycle of signals within a feedback loop. These signals may have waveforms that are not as sharp as those of signals outside of a feedback loop. Better duty cycle control may be important to achieve good linearity performance, e.g., good IIP2 performance in mixers operating based on LO signals generated from divided signals provided by the frequency divider. Second, the novel frequency divider may have a faster clock slew rate. The faster slew rate may increase switching speed, which may improve linearity and noise figure of mixers. Third, duty cycle control may be isolated from normal operation of the novel frequency divider. Fourth, fewer buffers may be used to buffer the divided signals and provide output signals. This may reduce power consumption of the novel frequency divider.

In an exemplary design, an apparatus (e.g., a wireless device, an IC, a circuit module, a circuit board, etc.) may include at least one divider circuit and at least one duty cycle adjustment circuit. The at least one divider circuit (e.g., divider circuit 610a to 610k in FIG. 6) may be coupled in a feedback loop, may receive a clock signal at a first frequency, and may provide at least one divided signal at a second frequency. The second frequency may be a fraction of the first frequency. The at least one duty cycle adjustment circuit (e.g., duty cycle adjustment circuits 620a to 620k in FIG. 6) may be coupled to the at least one divider circuit within the feedback loop, may adjust the duty cycle of the at least one divided signal, and may provide at least one duty cycle adjusted signal to the at least one divider circuit.

In an exemplary design, the at least one divider circuit may include first and second latches. The first latch (e.g., latch 310a in FIG. 3) may receive the clock signal and provide a first divided signal (e.g., the Idivp signal). The second latch (e.g., latch 310b) may receive the clock signal and provide a second divided signal (e.g., the Qdivp signal). The at least one duty cycle adjustment circuit may include first and second duty cycle adjustment circuits. The first duty cycle adjustment circuit (e.g., duty cycle adjustment circuit 320a) may receive the first divided signal from the first latch and provide a first duty cycle adjusted signal (e.g., the Iadjp signal) to the second latch. The second duty cycle adjustment circuit (e.g., duty cycle adjustment circuit 320b) may receive the second divided signal from the second latch and provide a second duty cycle adjusted signal (e.g., the Qadjp signal) to the first latch. The first and second latches and the first and second duty cycle adjustment circuits may perform divide-by-2. In this case, the second frequency may be one half of the first frequency. The first divided signal may comprise an inphase divided signal, and the second divided signal may comprise a quadrature divided signal.

In an exemplary design, the first duty cycle adjustment circuit may include an inverter and a duty cycle controller. The inverter (e.g., inverter 434 in FIGS. 4 and 5) may receive an adjustable bias current and provide the first duty cycle adjusted signal having an adjustable duty cycle determined based on the adjustable bias current. The duty cycle controller (e.g., duty cycle controller 436) may receive a duty cycle control signal and provide the adjustable bias current for the inverter. The adjustable bias current may be set based on and/or may be controlled to provide a desired duty cycle for the duty cycle adjusted signals. The first duty cycle adjustment circuit may also be implemented in other manners.

In an exemplary design, the duty cycle controller may include a look-up table and a bias current generator. The look-up table (e.g., look-up table 532 in FIG. 5) may receive the duty cycle control signal and provide at least one control signal. The bias current generator (e.g., bias current generator 534) may receive the at least one control signal and provide the adjustable bias current for the inverter. The duty cycle controller may also be implemented in other manners.

In an exemplary design, the first latch may further receive the second duty cycle adjusted signal (e.g., the Qadjp signal) and provide the first divided signal (e.g., the Idivp signal). The first latch may further receive the second divided signal (e.g., the Qdivp signal) and provide the first divided signal.

Figure 8:
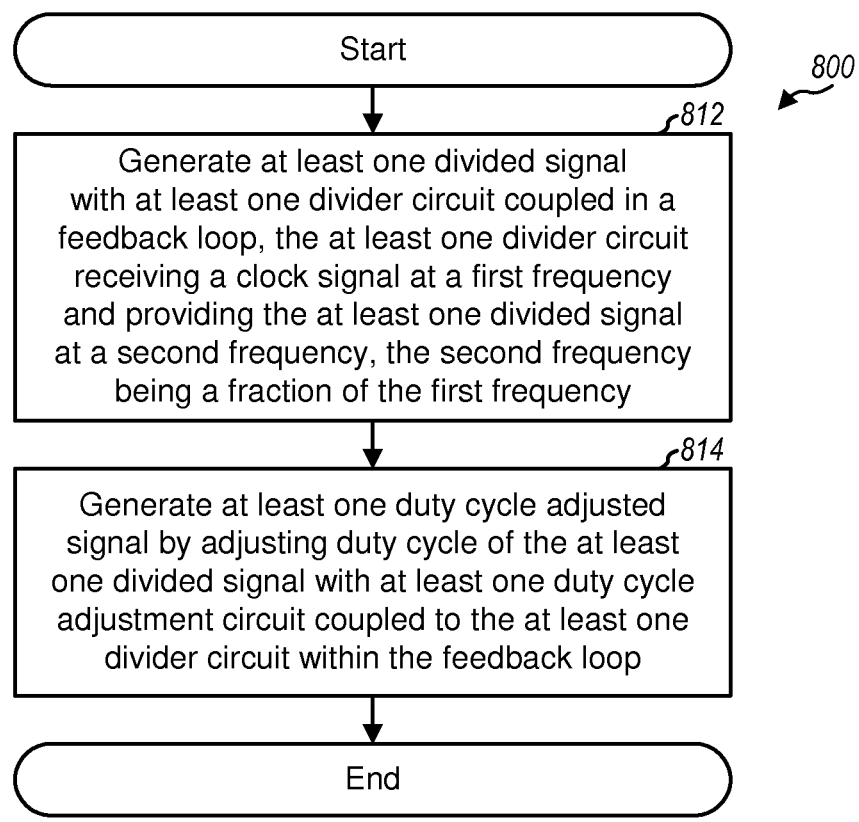
FIG. 8 shows a process for generating a frequency divided signal.

FIG. 8 shows a design of a process 800 for generating a frequency divided signal. At least one divided signal may be generated with at least one divider circuit coupled in a feedback loop (block 812). The at least one divider circuit may receive a clock signal at a first frequency and provide the at least one divided signal at a second frequency. The second frequency may be a fraction of the first frequency. At least one duty cycle adjusted signal may be generated by adjusting the duty cycle of the at least one divided signal with at least one duty cycle adjustment circuit coupled to the at least one divider circuit within the feedback loop (block 814).

In one design, the at least one divider circuit may comprise first and second latches. For block 812, a first divided signal may be generated with the first latch, and a second divided signal may be generated with the second latch. In one design, the at least one duty cycle adjustment circuit may comprise first and second duty cycle adjustment circuits. For block 814, a first duty cycle adjusted signal may be generated with the first duty cycle adjustment circuit. A second duty cycle adjusted signal may be generated with the second duty cycle adjustment circuit. The first duty cycle adjustment circuit may comprise an inverter. The first duty cycle adjusted signal may have an adjustable duty cycle determined based on an adjustable bias current of the inverter. The adjustable bias current for the inverter may be generated based on a duty cycle control signal. For example, at least one control signal may be generated based on the duty cycle control signal (e.g., with a look-up table as shown in FIG. 5). The adjustable bias current for the inverter may then be generated based on the at least one control signal (e.g., with a bias current generator as shown in FIG. 5).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
   multiple divider circuits (610a, 610k) coupled in a feedback loop, and each divider circuit configured to receive a clock signal at a first frequency and provide at least one divided signal at a second frequency, the second frequency being a fraction of the first frequency; and
   multiple duty cycle adjustment circuits (620a, 620k) each coupled to respective divider circuits within the feedback loop and configured to adjust duty cycle of the at least one divided signal provided by one of the divider circuits and provide at least one duty cycle adjusted signal to another one of the divider circuits, wherein the feedback loop is configured to have a last one of the duty cycle adjustment circuits provide its duty cycle adjusted signal to a first one of the divider circuits;
   wherein a component of the at least one of the multiple divider circuits receives the clock signal at a noninverting input and an inverting input to provide an output at a coupled node.

2. The apparatus of claim 1, the multiple divider circuits comprising:
   a first latch (310a) configured to receive the clock signal and provide a first divided signal; and
   a second latch (310b) configured to receive the clock signal and provide a second divided signal.

3. The apparatus of claim 2, the multiple duty cycle adjustment circuits comprising:
   a first duty cycle adjustment circuit (320a) configured to receive the first divided signal from the first latch and provide a first duty cycle adjusted signal to the second latch; and
   a second duty cycle adjustment circuit (320b) configured to receive the second divided signal from the second latch and provide a second duty cycle adjusted signal to the first latch.

4. The apparatus of claim 3, the first duty cycle adjustment circuit comprising:
   an inverter (434) configured to receive an adjustable bias current and provide the first duty cycle adjusted signal having an adjustable duty cycle determined based on the adjustable bias current.

5. The apparatus of claim 4, the first duty cycle adjustment circuit further comprising:
   a duty cycle controller (436) configured to receive a duty cycle control signal and provide the adjustable bias current for the inverter.

6. The apparatus of claim 5, the duty cycle controller comprising:
   a look-up table (532) configured to receive the duty cycle control signal and provide at least one control signal; and
   a bias current generator (534) configured to receive the at least one control signal and provide the adjustable bias current for the inverter.

7. The apparatus of claim 3, the first latch configured to further receive the second duty cycle adjusted signal and provide the first divided signal.

8. The apparatus of claim 7, the first latch configured to further receive the second divided signal from the second latch and provide the first divided signal.

9. The apparatus of claim 3, the first and second latches and the first and second duty cycle adjustment circuits configured to perform divide-by-2, and the second frequency being one half of the first frequency.

10. The apparatus of claim 3, the first divided signal comprising an inphase divided signal and the second divided signal comprising a quadrature divided signal.

11. The apparatus of claim 1, wherein a number of divider circuits is greater than a number of duty cycle adjustment circuits.

12. A method of generating a frequency divided signal, comprising:
   generating (712) at least one divided signal with multiple divider circuits coupled in a feedback loop, each divider circuit receiving a clock signal at a first frequency and providing the at least one divided signal at a second frequency, the second frequency being a fraction of the first frequency; and
   generating (714) at least one duty cycle adjusted signal to be provided to one divider circuit by adjusting duty cycle of the at least one divided signal provided by another divider circuit with multiple duty cycle adjustment circuits, each duty cycle adjustment circuit coupled to respective divider circuits within the feedback loop, wherein the feedback loop is configured to have a last one of the duty cycle adjustment circuits provide its duty cycle adjusted signal to a first one of the divider circuits;
   wherein a component of the at least one of the multiple divider circuits receives the clock signal at a noninverting input and an inverting input to provide an output at a coupled node.

13. The method of claim 12, the multiple divider circuits comprising first and second latches, the generating the at least one divided signal comprising:

generating a first divided signal with the first latch; and
generating a second divided signal with the second latch.

14. The method of claim 13, the multiple duty cycle adjustment circuits comprising first and second duty cycle adjustment circuits, the generating the at least one duty cycle adjusted signal comprising:
generating a first duty cycle adjusted signal with the first duty cycle adjustment circuit; and
generating a second duty cycle adjusted signal with the second duty cycle adjustment circuit.

15. The method of claim 14, the first duty cycle adjustment circuit comprising an inverter, the generating the first duty cycle adjusted signal comprising:
generating the first duty cycle adjusted signal having an adjustable duty cycle determined based on an adjustable bias current of the inverter.

16. The method of claim 15, further comprising:
generating the adjustable bias current for the inverter based on a duty cycle control signal.

17. The method of claim 15, further comprising:
generating at least one control signal based on a duty cycle control signal; and generating the adjustable bias current for the inverter based on the at least one control signal.

18. An apparatus comprising:
multiple means for receiving a clock signal at a first frequency and generating at least one divided signal at a second frequency based on the clock signal, the second frequency being a fraction of the first frequency; and
multiple means for generating at least one duty cycle adjusted signal by adjusting duty cycle of the at least one divided signal, each means for generating the at least one duty cycle adjusted signal being coupled to respective means for receiving the clock signal in a feedback loop, wherein the feedback loop is configured to have a last of the means for generating at least one duty cycle adjusted signal provide its duty cycle adjusted signal to a first of the means for receiving the clock signal;
wherein a component of the at least one of the multiple means for receiving receives the clock signal at a non-inverting input and an inverting input to provide an output at a coupled node.

19. The apparatus of claim 18, the multiple means for generating the at least one divided signal comprising:
first latching means configured to generate a first divided signal; and
second latching means configured to generate a second divided signal.

20. The apparatus of claim 19, the multiple means for generating the at least one duty cycle adjusted signal comprising:
first duty cycle adjustment means configured to generate a first duty cycle adjusted signal; and
second duty cycle adjustment means configured to generate a second duty cycle adjusted signal.

21. The apparatus of claim 20, the first duty cycle adjustment means configured to generate the first duty cycle adjusted signal having an adjustable duty cycle determined based on an adjustable bias current.

22. The apparatus of claim 21, further comprising:
means for generating the adjustable bias current based on a duty cycle control signal.

23. A non-transitory computer-readable medium comprising:
code for causing at least one processor to direct generation of at least one divided signal with multiple divider circuits coupled in a feedback loop, each of the divider circuits receiving a clock signal at a first frequency and providing the at least one divided signal at a second frequency, the second frequency being a fraction of the first frequency; and
code for causing the at least one processor to direct generation of at least one duty cycle adjusted signal by adjusting duty cycle of the at least one divided signal with multiple duty cycle adjustment circuits, each duty cycle adjustment circuit coupled to respective divider circuits within the feedback loop, wherein the feedback loop is configured to have a last one of the duty cycle adjustment circuits provide its duty cycle adjusted signal to a first one of the divider circuits;
wherein a component of the at least one of the multiple divider circuits receives the clock signal at a noninverting input and an inverting input to provide an output at a coupled node.

* * * * *